(12) United States Patent
Pierreux et al.

(10) Patent No.: US 11,056,353 B2
(45) Date of Patent: Jul. 6, 2021

(54) METHOD AND STRUCTURE FOR WET ETCH UTILIZING ETCH PROTECTION LAYER COMPRISING BORON AND CARBON

(71) Applicant: ASM IP Holding B.V., Almere (NL)

(72) Inventors: Dieter Pierreux, Dilbeek (BE); Werner Knaepen, Leuven (BE); Bert Jongbloed, Oud-Heverlee (BE)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 15/994,236

(22) Filed: May 31, 2018

(65) Prior Publication Data

US 2018/0350623 A1      Dec. 6, 2018

Related U.S. Application Data (60) Provisional application No. 62/513,898, filed on Jun. 1, 2017.

(51) Int. Cl.
| | | |
|---|---|---|
| *H01L 21/3213* | (2006.01) | |
| *C23F 1/16* | (2006.01) | |

(Continued)

(52) U.S. Cl.
CPC ......... *H01L 21/32134* (2013.01); *C23F 1/16* (2013.01); *H01L 21/0228* (2013.01); *H01L 21/0234* (2013.01); *H01L 21/02112* (2013.01); *H01L 21/02271* (2013.01); *H01L 21/3081* (2013.01); *H01L 21/30604* (2013.01);

(Continued)

(58) Field of Classification Search
None
See application file for complete search history.

(56) References Cited

U.S. PATENT DOCUMENTS

| | | |
|---|---|---|
| 4,683,147 A | 7/1987 | Eguchi et al. |
| 4,696,834 A | 9/1987 | Varaprath |

(Continued)

FOREIGN PATENT DOCUMENTS

| | | |
|---|---|---|
| JP | 2006-190770 | 7/2006 |
| JP | 2013-125762 | 6/2013 |

(Continued)

OTHER PUBLICATIONS

Cho, Namtae, "Processing of Boron Carbide," Ph.D. Thesis, School of Materials Science and Engineering, Georgia Institute of Technology, 2006, in 89 pages.

(Continued)

*Primary Examiner* — Allan W. Olsen
(74) *Attorney, Agent, or Firm* — Knobbe, Martens, Olson & Bear LLP (57) ABSTRACT

The disclosure relates generally to the field of processing substrates, for example comprising materials such as quartz, glass or silicon. The disclosure more particular relates to providing wet etch protection layers comprising boron and carbon and etching the substrate in a hydrogen fluoride aqueous solution. One or more of the boron and carbon containing films can have a thickness of at least 5, preferably 10 and, more preferably 30 nm. The method comprises wet etching the substrate in a hydrofluoric acid solution with a hydrogen fluoride concentration of at least 10 wt. % for at least 5 minutes.

17 Claims, 3 Drawing Sheets

(51) Int. Cl.
*H01L 21/306* (2006.01)
*H01L 21/02* (2006.01)
*H01L 21/311* (2006.01)
*H01L 21/308* (2006.01)

(52) U.S. Cl.
CPC ... *H01L 21/31111* (2013.01); *H01L 21/31122* (2013.01); *H01L 21/31144* (2013.01); *H01L 21/32139* (2013.01)

(56) References Cited

U.S. PATENT DOCUMENTS

| | | | |
|---|---|---|---|
| 5,066,533 A * | 11/1991 | America | B81C 1/00063 216/83 |
| 6,475,276 B1 | 11/2002 | Elers et al. | |
| 6,586,056 B2 | 7/2003 | Arkles et al. | |
| 6,933,245 B2 | 8/2005 | Lee et al. | |
| 7,625,609 B2 | 12/2009 | Matsuura | |
| 7,651,955 B2 | 1/2010 | Ranish et al. | |
| 8,080,290 B2 | 12/2011 | Hasebe et al. | |
| 8,114,761 B2 | 2/2012 | Mandrekar et al. | |
| 8,119,544 B2 | 2/2012 | Hasebe et al. | |
| 8,227,346 B2 | 7/2012 | Miya et al. | |
| 8,242,031 B2 | 8/2012 | Mallick et al. | |
| 8,329,599 B2 | 12/2012 | Fukazawa et al. | |
| 8,563,096 B2 | 10/2013 | Matsunaga et al. | |
| 8,580,664 B2 | 11/2013 | Clark | |
| 8,722,546 B2 | 5/2014 | Fukazawa et al. | |
| 9,257,275 B2 * | 2/2016 | Sano | H01L 21/0228 |
| 9,362,109 B2 | 6/2016 | Pore | |
| 9,543,140 B2 | 1/2017 | Pore | |
| 9,576,790 B2 | 2/2017 | Pore et al. | |
| 9,922,817 B2 * | 3/2018 | Pore | H01L 21/0217 |
| 2001/0012701 A1 | 8/2001 | Kang et al. | |
| 2002/0061659 A1 | 5/2002 | Abe | |
| 2002/0119327 A1 | 8/2002 | Arkles et al. | |
| 2002/0180228 A1 | 12/2002 | Borovik et al. | |
| 2003/0097987 A1 | 5/2003 | Fukuda | |
| 2003/0215570 A1 | 11/2003 | Seutter et al. | |
| 2003/0228770 A1 | 12/2003 | Lee et al. | |
| 2004/0121085 A1 | 6/2004 | Wang et al. | |
| 2004/0146644 A1 | 7/2004 | Xiao et al. | |
| 2005/0025885 A1 | 2/2005 | McSwiney et al. | |
| 2005/0145177 A1 | 7/2005 | McSwiney et al. | |
| 2005/0159017 A1 | 7/2005 | Kim et al. | |
| 2005/0181633 A1 | 8/2005 | Hochberg et al. | |
| 2006/0019032 A1 | 1/2006 | Wang et al. | |
| 2006/0084283 A1 | 4/2006 | Paranjpe et al. | |
| 2006/0148271 A1 | 7/2006 | Borovik et al. | |
| 2007/0116888 A1 | 5/2007 | Faguet | |
| 2007/0232071 A1 | 10/2007 | Balseanu et al. | |
| 2007/0251444 A1 | 11/2007 | Gros-Jean et al. | |
| 2008/0020591 A1 | 1/2008 | Balseanu et al. | |
| 2008/0242116 A1 | 10/2008 | Clark | |
| 2008/0274605 A1 | 11/2008 | Hoshi et al. | |
| 2008/0292798 A1 | 11/2008 | Huh et al. | |
| 2009/0155606 A1 | 6/2009 | Yoon et al. | |
| 2009/0163041 A1 | 6/2009 | Mungekar et al. | |
| 2009/0263972 A1 | 10/2009 | Balseanu et al. | |
| 2009/0311857 A1 | 12/2009 | Todd et al. | |
| 2010/0041243 A1 | 2/2010 | Cheng et al. | |
| 2010/0124621 A1 | 5/2010 | Kobayashi et al. | |
| 2010/0304574 A1 | 12/2010 | Nodera et al. | |
| 2011/0086516 A1 | 4/2011 | Lee et al. | |
| 2011/0129990 A1 | 6/2011 | Mandrekar et al. | |
| 2011/0183528 A1 | 7/2011 | Wang et al. | |
| 2011/0256734 A1 | 10/2011 | Hausmann et al. | |
| 2012/0009802 A1 | 1/2012 | LaVoie et al. | |
| 2012/0021127 A1 | 1/2012 | Sato et al. | |
| 2012/0028469 A1 | 2/2012 | Onizawa et al. | |
| 2012/0077350 A1 | 3/2012 | Miya et al. | |
| 2012/0164848 A1 | 6/2012 | Fujii et al. | |
| 2012/0178264 A1 | 7/2012 | Murakami et al. | |
| 2012/0196450 A1 | 8/2012 | Balseanu et al. | |
| 2012/0213940 A1 | 8/2012 | Mallick | |
| 2013/0040447 A1 | 2/2013 | Swaminathan et al. | |
| 2013/0078392 A1 | 3/2013 | Xiao et al. | |
| 2013/0084714 A1 | 4/2013 | Oka et al. | |
| 2013/0115763 A1 | 5/2013 | Takamure et al. | |
| 2013/0157466 A1 | 6/2013 | Fox et al. | |
| 2013/0171839 A1 | 7/2013 | Nguyen et al. | |
| 2013/0175621 A1 | 7/2013 | Chen et al. | |
| 2013/0224964 A1 | 8/2013 | Fukuzawa et al. | |
| 2013/0252439 A1 | 9/2013 | Hirose et al. | |
| 2013/0330933 A1 | 12/2013 | Fukuzawa et al. | |
| 2014/0023794 A1 | 1/2014 | Mahajani et al. | |
| 2014/0030444 A1 | 1/2014 | Swaminathan et al. | |
| 2014/0073142 A1 | 3/2014 | Hirose et al. | |
| 2014/0073144 A1 | 3/2014 | Chatterjee et al. | |
| 2014/0113457 A1 | 4/2014 | Sims et al. | |
| 2014/0124841 A1 | 5/2014 | Xie et al. | |
| 2014/0193983 A1 | 7/2014 | LaVoie | |
| 2014/0227458 A1 | 8/2014 | Karakawa | |
| 2014/0273528 A1 | 9/2014 | Niskanen et al. | |
| 2014/0273529 A1 | 9/2014 | Nguyen et al. | |
| 2014/0335701 A1 | 11/2014 | Sano et al. | |
| 2014/0342573 A1 | 11/2014 | Hirose et al. | |
| 2014/0363980 A1 | 12/2014 | Kawamata et al. | |
| 2015/0031218 A1 | 1/2015 | Karakawa | |
| 2015/0104955 A1 | 4/2015 | Pore | |
| 2015/0147891 A1 | 5/2015 | Sano et al. | |
| 2015/0162185 A1 | 6/2015 | Pore | |
| 2015/0206719 A1 | 7/2015 | Swaminathan et al. | |
| 2015/0287588 A1 | 10/2015 | Sano et al. | |
| 2015/0287591 A1 | 10/2015 | Pore et al. | |

FOREIGN PATENT DOCUMENTS

| | | |
|---|---|---|
| WO | WO 2012/144523 A1 | 10/2012 |
| WO | WO 2013/121936 | 8/2013 |
| WO | WO 2017/046921 | 3/2017 |
| WO | WO 2017/149604 | 9/2017 |

OTHER PUBLICATIONS

Domnich, et al., "Boron Carbide: Structures, Properties, and Stability under Stress," J. Am. Ceram. Soc., vol. 94, No. 11, 2011, pp. 3605-3628.
Final Office Action dated Feb. 24, 2015 in U.S. Appl. No. 14/167,904.
Final Office Action dated Mar. 23, 2016 in U.S. Appl. No. 14/167,904.
Keinan et al., "Diiodosilane. 1. A Novel Reagent for Deoxygenation of Alcohols and Ethers," J.Org. Chem., 1987, vol. 52, pp. 4846-4851.
Keinan et al., "Diiodosilane. 2. A Multipurpose Reagent for Hydrolysis and Reductive Iodination of Ketals, Acetals, Ketones, and Aldehydes," J. Org. Chem., 1990, vol. 55, pp. 2927-2938.
Keinan et al., "Diiodosilane. 3. Direct Synthesis of Acyl Iodides from Carboxylic Acids, Esters, Lactones, Acyl Chlorides, and Anhydrides," J. Org. Chem., 1990, vol. 55, pp. 3922-3926.
Knoops, Harm C.M. et al. "Plasma-assisted ALD of Silicon Nitride from BTBAS" 13th International Conference on Atomic Layer Deposition, Jul. 28-31, 2013, San Diego, California, U.S.A., 21 pages.
Lowenstein et al., "Chemical Etching of Thermally Oxidized Silicon Nitride: Comparison of Wet Dry Etching Methods," Journal of the Electrochemical Society 138.5, 1991, pp. 1389-1394.
Office Action dated Jun. 17, 2014 in U.S. Appl. No. 14/167,904.
Office Action dated Jun. 5, 2014 in U.S. Appl. No. 14/062,328.
Office Action dated Oct. 6, 2015 in U.S. Appl. No. 14/167,904.
Office Action dated Oct. 20, 2016 in U.S. Appl. No. 14/167,904.
Pedersen et al., "Low Temperature CVD of Thin, Amorphous Boron-Carbon Films for Neutron Detectors," Chemical Vapor Deposition, vol. 18, Issue 7-9, 2012, pp. 221-224.
Sarubbi, et al., "Pure Boron-Doped Photodiodes: a Solution for Radiation Detection in EUV Lithography," ESSDERC 2008—38th European Solid-State Device Research Conference, 2008, pp. 278-281.
Tamizhmani et al., "Physical Characterization of a-Si Thin Films Deposited by Thermal Decomposition of Iodosilanes," J. Phys.D: Appl. Phys., 1991, vol. 23, pp. 1015-1021.

(56) References Cited

OTHER PUBLICATIONS

Tamizhmani et al., "Some Physical Properties of Undoped Amorphous Silicon Prepared by a New Chemical Vapor Deposition Process Using Iodosilanes," Chem. Mater., 1990, vol. 2, pp. 473-476.

Triyoso et al., "Robust PEALD SiN spacer for gate first high-k metal gate integration", IEEE, 2012, 4 pages.

* cited by examiner

FIG. 8

METHOD AND STRUCTURE FOR WET ETCH UTILIZING ETCH PROTECTION LAYER COMPRISING BORON AND CARBON

CROSS-REFERENCE TO RELATED APPLICATION

This application claims priority to U.S. Provisional Application No. 62/513,898, filed Jun. 1, 2017, which is hereby incorporated by reference in its entirety.

BACKGROUND

Field

The disclosure relates generally to the field of processing substrates. The disclosure more particular relates to wet etch protection layers.

Description of the Related Art

Etch protection layers may be used for processing of substrates, comprising materials such as quartz, glass or silicon, to form semiconductor devices. As the physical geometries of the semiconductor devices shrink, the formation of 3-dimensional structures has been proposed as a way to increase the density of electronic features over a given substrate area. As a result, the deposition of films on three-dimensional structures having high aspect ratios is desired.

Therefore, deposition processes that provide films that can demonstrate conformal coverage of three-dimensional structures having high aspect ratios are desired. Additionally, it is desirable to have films forming etch protection layers that demonstrate an advantageous etch selectivity with respect one or more other materials in the semiconductor device, and/or a desirable etch rate in a dry etch and/or wet etch process.

SUMMARY

In some embodiments, a method comprises providing a substrate and heating the substrate to a temperature of between about 200° C. and about 450° C., preferably between about 300° C. and about 425° C., and more preferably between about 350° C. and about 400° C. The heated substrate may be contacted with a vapor phase boron precursor to form a boron and carbon-comprising wet etch protection layer (e.g., an etch stop or etch mask) with a thickness of at least about 5 nm, preferably at least about 10 nm and, more preferably about 20 nm, even more preferably about 30 nm. The method may comprise wet etching a substrate with the etch protection layer in a wet etch of a hydrofluoric acid solution with a hydrogen fluoride concentration of at least about 10 wt. %, preferably at least about 20 wt. %, more preferably at least about 30 wt. % and even more preferably at least about 49 wt. % for at least about 5 minutes, preferably at least about 10 minutes, and most preferably at least about 20 minutes while protecting at least a portion of the substrate with the boron and carbon comprising etch protection layer.

In some embodiments, the vapor phase boron precursor comprises triethylboron or trimethylboron. The vapor phase boron precursor may be supplied to the reaction space with a carrier gas, e.g. comprising an inert gas such as argon. The method may comprise maintaining a pressure of about 0.1 Torr to about 10 Torr within the reaction space during exposing the substrate to the vapor phase boron precursor. The vapor phase boron precursor may decompose on the substrate.

The method may comprise depositing a silicon oxide film on the substrate prior to depositing the boron and carbon-comprising wet etch protection layer. The boron and carbon-comprising layer may also be deposited directly on a silicon oxide comprising substrate e.g. a quartz or glass substrate. The boron and carbon-comprising layer may also be deposited directly on a semiconductor substrate.

In an embodiment, the wet etch protection layer is a diffusion barrier protecting the underlying substrate for a hydrofluoric acid solution with a hydrogen fluoride concentration of at least about 10 wt. %, preferably at least about 20 wt. %, more preferably at least about 30 wt. %, and even more preferably at least about 49 wt. % for at least about 5 minutes, preferably at least about 10 minutes, and most preferably at least about 20 minutes.

According to a further embodiment, there is provided a device manufacturing method comprising providing a substrate with an etch protection layer as described above and further comprising:

providing a masking layer on the boron and carbon-comprising wet etch protection layer;

patterning the masking layer;

anisotropic etching the boron and carbon-comprising wet etch protection layer through the patterned masking layer to create a patterned boron and carbon comprising wet etch protection layer; and, wet etching the substrate through the boron and carbon-comprising wet etch protection layer.

In an embodiment, anisotropic etching comprises using an oxygen-containing plasma or an ion beam etching. In an embodiment, the method comprises removing the boron and carbon-comprising layer with an ashing process.

According to a further embodiment there is provided a device comprising: a boron and carbon-comprising wet etch protection layer having a thickness of at least about 5 nm and exposed to a hydrogen fluoride concentration of at least about 10 wt. %. In some embodiments, the exposure occurs for at least 5 minutes, more preferably at least about 10 minutes and, most preferably at least about 20 minutes. The boron and carbon-comprising wet etch protection layer may, for example, have a thickness between about 5 to about 10 nm. The thickness is preferably at least about 10 nm and, more preferably, at least about 30 nm. In some embodiments, the hydrogen fluoride concentration of the hydrofluoric solution is at least about 30 wt. % and even more preferably at least about 49 wt. %.

For purposes of summarizing some embodiments and advantages achieved over the prior art, certain objects and advantages are described herein. Of course, it is to be understood that not necessarily all such objects or advantages need to be achieved in accordance with any particular embodiment. Thus, for example, those skilled in the art will recognize that the invention may be embodied or carried out in a manner that can achieve or optimize one advantage or a group of advantages without necessarily achieving other objects or advantages.

All of these embodiments are intended to be within the scope of the invention herein disclosed. These and other embodiments will become readily apparent to those skilled in the art from the following detailed description having reference to the attached figures, the invention not being limited to any particular disclosed embodiment(s).

BRIEF DESCRIPTION OF THE DRAWINGS

The above-noted and other features, aspects, and advantages of the present disclosure are described with reference to the drawings of certain embodiments, which are intended to illustrate certain embodiments and not to limit the invention.

DETAILED DESCRIPTION

Although certain embodiments and examples are described below, those of skill in the art will appreciate that the invention extends beyond the specifically disclosed embodiments and/or uses and obvious modifications and equivalents thereof. Thus, it is intended that the scope of the invention herein disclosed should not be limited by any particular embodiments described below.

Films comprising boron and carbon have been found to have a variety of desirable properties, including chemical stability, mechanical strength, diffusion resistance, thermal and electrical properties. As a result, such films may have diverse applications in many technical fields, including applications in the semiconductor, medical, military, space and nuclear industries. For example, boron carbon films are used as neutron detectors, in the fabrication of semiconductor devices, and in the fabrication of microelectromechanical systems (MEMS). They may be used in tribological coatings for MEMS components and/or as sacrificial films in semiconductor device fabrication processes. In some embodiments, boron and carbon-containing films can be used as a cap layer, an etch stop layer, as a layer for facilitating photolithography patterning processes, and/or as a doping layer (e.g., as a boron dopant source) on top of quartz, glass or silicon substrates.

Advantageously, as described herein, a boron and carbon (B,C) film can be used in some embodiments as a dopant film in a semiconductor device fabrication process. For example, the boron and carbon film can provide a dopant source for a semiconductor substrate, such as a silicon substrate. In some embodiments, films comprised essentially of boron and carbon can serve as a solid state diffusion (SSD) layer, where the boron can serve as a dopant. For example, the boron and carbon film can be deposited over a substrate and the deposited boron and carbon film can subsequently be subjected to an anneal process such that boron from the boron and carbon film is driven into the underlying substrate.

A cap layer is typically used in conventional solid state doping schemes to reduce or prevent out-diffusion of dopant before, after or during the anneal process. However, in some embodiments, a boron and carbon solid state diffusion layer can advantageously be used as a dopant film without or substantially without a cap layer directly over the boron and carbon solid state diffusion layers.

In some embodiments, films comprised essentially of boron and carbon can serve as a cap layer formed over a solid state diffusion layer. For example, a conventionally formed solid state diffusion layer, including a conventionally formed solid state diffusion layer containing boron, can be deposited over a silicon substrate, and a boron and carbon cap layer can be deposited over the conventionally formed solid state diffusion layer, such that the film stack can be subsequently subjected to a thermal anneal process to drive dopant into the underlying silicon substrate.

For example, films deposited according to one or more processes described herein, such as a boron and carbon film can demonstrate improved step coverage, and a reduced etch rate in exposure to a wet etchant (e.g., resistance against wet etchant, such as a hydrofluoric acid solution with a hydrogen fluoride concentration of at least about 5 wt. %, at least about 10 wt. %, preferably at least about 15 wt. %, more preferably at least about 30 wt. %, and even more preferably at least about 49 wt. % for at least about 5 minutes, preferably at least about 10 minutes, and most preferably at least about 20 minutes).

In some embodiments, a boron and carbon film described herein can be used with another material for enhancing etch selectivity of a resulting structure formed from the boron and carbon film and the other material. For example, in some embodiments, a boron and carbon film described herein can be used as an etch stop layer underneath another layer, or as a cap layer over another layer, where the boron and carbon film is protecting the other layer to certain wet etchants (e.g., HF solution).

Boron and Carbon Films

As described herein, films comprised primarily of boron and carbon (also referred to boron carbon films, boron and carbon films, or B,C films, as discussed below) and formed according to one or more processes described herein can advantageously demonstrate various desirable characteristics. In some embodiments, the boron and carbon films can advantageously demonstrate desirable levels of conformality when deposited on three-dimensional (3-D) features of a substrate, such as 3-D features having high aspect ratios. For example, the boron and carbon films may have a conformality of greater than about 90%, including greater than about 95%, when deposited on features having aspect ratios of about 3:1 or higher, including about 10:1 or higher, about 20:1 or higher, about 25:1 or higher, about 40:1 or higher, about 50:1 or higher, or about 80:1 or higher. In some embodiments, the boron and carbon films have a conformality greater than about 90%, including greater than about 95%, when deposited on features having aspect ratios of about 20:1 or greater, including about 40:1 or higher, and about 80:1 or greater.

In some embodiments, the boron and carbon films can demonstrate reduced wet etch rates relative to thermal silicon oxides. In some embodiments, the boron and carbon films can have negligible wet etch rates in a hydrofluoric (HF) acid solution with a hydrogen fluoride concentration of at least about 5 wt. %, preferably at least about 15 wt. %, more preferably at least about 30 wt. %, and even more preferably at least about 49 wt. % for at least about 5 minutes, preferably at least about 10 minutes, and most preferably at least about 20 minutes. In some embodiments, the boron and carbon films have a wet etch rate of less than about 0.2 nanometers per min (nm/min) in HF, preferably less than about 0.1 nm/min, and more preferably less than about 0.05 nm/min.

In some embodiments, the boron and carbon films can exhibit etch rates of less than about 0.2 nm/min, preferably less than about 0.1 nm/min, and more preferably less than about 0.05 nm/min, in wet etchants comprising nitric acid ($HNO_3$) sodium hydroxide (NaOH), hydrochloric acid (HCl) sulfuric acid ($H_2SO_4$), and/or phosphoric acid ($H_3PO_4$). In some embodiments the wet etch rate is below the detection limit using one of the recited etchants.

In some embodiments, boron and carbon films formed according to one or more processes described herein form a diffusion barrier protecting the underlying substrate for a hydrofluoric acid solution with a hydrogen fluoride concentration of at least about 5 wt. %, preferably at least about 15 wt. %, more preferably at least about 30 wt. %, and even more preferably at least about 49 wt. % for at least about 5 minutes, preferably at least about 10 minutes, and most preferably at least about 20 minutes.

In some embodiments, boron and carbon films formed according to one or more processes described herein demonstrate desirable etch resistance while having a desirable film density, such as film densities of about 2.0 grams to about 2.5 grams per cubic centimeter ($g/cm^3$). For example, the boron and carbon films may have wet etch rates as described herein while having film densities of about 2.0 $g/cm^3$ to about 2.5 $g/cm^3$.

In some embodiments, a boron and carbon film deposited on a surface comprising silicon (e.g., on a surface of a silicon based layer, such as a silicon layer, a silicon nitride layer, a silicate layer etc.) can demonstrate increased uniformity and/or conformality, such as compared to a boron and carbon film deposited on a surface of a different material (such as a material that does not comprise silicon). For example, a boron and carbon film deposited on a silicon nitride (SiN) surface (e.g., on a surface of a silicon nitride layer, for example on a silicon nitride substrate) can demonstrate increased uniformity. Without being limited by any particular theory or mode of operation, an improved interaction between the silicon-based surface and one or more components of the boron and carbon film may advantageously facilitate the improved uniformity and/or conformality of the deposited film.

As discussed above, a boron and carbon film typically comprises primarily boron and carbon. The formula of a boron and carbon film is generally referred to herein as B,C for convenience and simplicity. However, the skilled artisan will understand that the actual formula of a B,C film can be $B_xC$. In some embodiments, for example, x can vary from about 0.1 to about 25. In some cases, x preferably varies from about 1 to about 10, and more preferably from about 1 to about 2. For example, x can be about 1.5.

In some embodiments, a boron and carbon film is deposited on a substrate by a CVD process comprising decomposing one or more boron precursors (e.g., boron reactants) on a substrate surface at a temperature of less than about 400° C., and at a pressure of about 0.001 Torr to about 760 Torr, including from about 1 Torr to about 10 Torr, or about 0.001 Torr to about 10 Torr. In some embodiments, a boron precursor may comprise both boron and carbon. Thus, in some embodiments a CVD process for depositing a boron and carbon film may include decomposition of a single boron precursor comprising both boron and carbon, without or essentially without any additional precursors in the deposition process. In some embodiments, a CVD process comprises decomposing two or more precursors on the substrate surface to form the boron and carbon film. In some embodiments, at least one of the two or more precursors comprises boron (B). In some embodiments, at least one of the two or more precursors comprises carbon (C). In some embodiments, the two or more precursors may each comprise boron and carbon. For example, a CVD process for depositing a boron and carbon film may include decomposition of two or more boron precursors, each of the two or more boron precursors comprising both boron and carbon, where the CVD process does not include any additional precursors other than the boron precursors (e.g., not including any precursors separately for providing the carbon in the boron and carbon film).

In some embodiments, no or substantially no plasma is used in the deposition of the boron and carbon films (e.g., no or substantially no plasma is used for boron and carbon film growth). In some embodiments, a CVD process may be a pulsed thermal CVD process in which multiple pulses of a single boron precursor are provided to deposit a film of desired thickness. In some embodiments, a single, pulse of the boron precursor is provided to deposit a film of the desired thickness. A thermal CVD process may comprise no plasma or substantially no plasma in the decomposition of precursors. In some embodiments, a purge step may be performed between boron precursor pulses, for example to remove excess reactant and/or reaction byproducts from the reaction space. In some embodiments the substrate may be moved to a space in which it is not exposed to the precursor.

In some embodiments, a boron precursor pulse can comprise one or more carrier gases, such as nitrogen gas and/or a noble gas (e.g., argon gas, helium gas, neon gas, and/or xenon gas). In some embodiments, the boron precursor pulse comprises a mixture of two or more carrier gases. In some embodiments, a mixture of two or more carrier gases comprises argon gas and/or hydrogen gas. For example, a mixture of two or more carrier gases can comprise two or more gases selected from nitrogen gas, helium gas, neon gas, xenon gas, argon gas, and hydrogen gas.

In some embodiments, a process for depositing a boron and carbon film includes a single carrier gas and a single boron precursor, where the single boron precursor comprises both boron and carbon, and where the process does not include any other precursors or carrier gases. For example, the single carrier gas may include an inert gas, for example nitrogen gas ($N_2$) or a noble gas (e.g., argon (Ar) gas or helium (He) gas). For example, a boron precursor pulse for the process may comprise the single boron precursor and nitrogen gas ($N_2$), argon (Ar) gas or helium (He) gas. In some embodiments, a process for depositing a boron and carbon film includes a carrier gas mixture and a single boron precursor, where the single boron precursor comprises both boron and carbon, and where the process does not include any other gases other than the carrier gas mixture and the boron precursor. In such embodiments, the carrier mixture may include nitrogen gas ($N_2$) and a noble gas, such as nitrogen gas ($N_2$) and argon (Ar) or nitrogen gas ($N_2$) and helium (He). For example, a boron precursor pulse for the process may comprise the single boron precursor and nitrogen gas (N$_2$) and argon (Ar) gas, or the single boron precursor and nitrogen gas (N$_2$) and helium (He) gas.

As discussed in further details below, in some embodiments the CVD process is a cyclic deposition process in which reactants are provided cyclically. For example, deposition of a boron and carbon film on a substrate may include repeating two or more deposition cycles in which the substrate is contacted with the reactants to achieve desired film thickness.

In other embodiments, the CVD process can be a continuous flow process. For example, deposition of a boron and carbon film on a substrate may include continuously or substantially continuously exposing the substrate to the reactants for a single period of time to achieve desired film thickness. For example, a about 20-150 sccm or even up to about 1 slm TEB flow simultaneously with a purge gas of for example nitrogen as contemplated for continuous CVD, giving growth rate of about 0.1 to about 10 nm/min.

Figure 1:
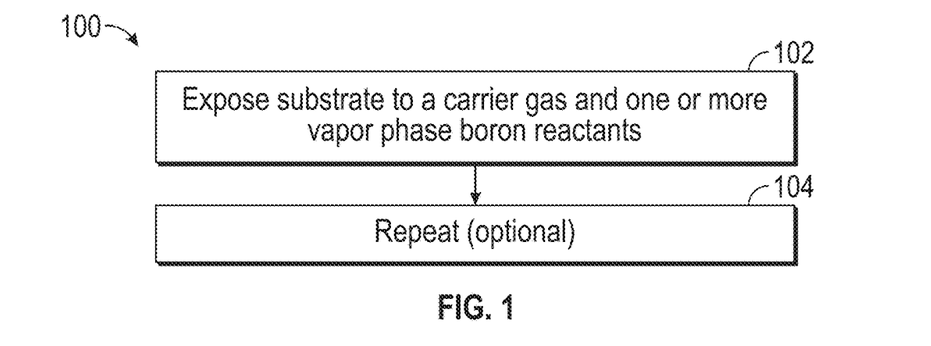
FIG. 1 shows a flow chart of an example of a process for depositing a boron and carbon-comprising film, according to some embodiments.

FIG. 1 shows a flow chart 100 illustrating a process for forming a boron and carbon (B,C) film. In block 102, a substrate is exposed to one or more vapor phase boron reactants (e.g., boron and/or carbon precursors). A carrier gas may be used to transport the one or more vapor phase boron reactants to the substrate. In some embodiments the carrier gas may facilitate one or more interactions between reactants and/or between reactants and the substrate surface for forming the boron and carbon film, while not or substantially not contributing to growth of the boron and carbon film.

In some embodiments, the substrate is exposed to a single vapor phase boron reactant. In some embodiments, the single vapor phase boron reactant comprises both boron (B) and carbon (C). In some embodiments, the substrate is exposed to two or more vapor phase reactants. For example, at least one of the two or more vapor phase reactants comprises carbon (C) and at least one of the two or more vapor phase reactants comprises boron (B).

In some embodiments, the carrier gas can comprise an inert carrier gas, such as argon (Ar), nitrogen gas (N$_2$), helium (He), xenon (Xe) and/or neon (Ne). In some embodiments, the carrier gas can comprise a mixture of two or more gases, including two or more gases selected from nitrogen gas, helium gas, neon gas, xenon gas, argon gas, and hydrogen gas.

Optionally, in block 104, exposure of the substrate to the carrier gas and the one or more vapor phase boron reactants can be repeated a number of times, such as in a pulsed CVD process. For example, the substrate can be exposed to the carrier gas and the one or more vapor phase boron reactants for a first duration of time, and the exposure may be repeated less than about 100 times, including from about 1 to about 100 times, about 2 to about 50 times, about 3 to about 20 times, or about 5 to about 10 times.

In some embodiments a process for depositing a boron and carbon (B,C) film may include a thermal chemical vapor deposition (CVD) process. Referring to FIG. 1, in some embodiments the process 100 includes a thermal CVD process performed at reduced process temperatures, for example temperatures less than about 400° C. A thermal CVD process can be a process in which no or substantially no plasma is applied, such as for facilitating decomposition of precursors used to deposit the film. The process temperature as referred to herein can comprise a temperature of a reactor chamber susceptor, a reactor chamber wall, and/or a temperature of the substrate itself. For example, in some embodiments the process 100 for depositing the boron and carbon film can be performed with a process temperature of up to about 400° C. In some embodiments, the process 100 for depositing the boron and carbon film can be performed with a process temperature of about 325° C. to about 400° C., preferably about 350° C. to about 400° C., and most preferably about 375° C. to about 400° C. Without being limited by any particular theory or mode of operation, deposition of boron and carbon films at temperatures less than about 400° C. may advantageously facilitate deposition in a surface reaction limited regime, facilitating formation of boron and carbon films having one or more desirable characteristics described herein (e.g., increased conformality performance, increased uniformity, and/or decreased etch rate).

In some embodiments, deposition of boron and carbon films (B,C) can be performed at process temperatures of about 200° C. to about 450° C., including for example, about 250° C. to about 400° C., or about 400° C. to about 425° C.

In some embodiments, deposition of boron and carbon films (B,C) can be performed, such as in single wafer reactors, at process temperatures of up to about 450° C., including about 300° C. to about 450° C., or about 400° C. to about 425° C. For example, in some embodiments a boron and carbon film can be deposited at process temperatures of about 400° C. to about 450° C., such as at about 430° C. For example, deposition of boron and carbon films in single wafer reactors can be performed at process temperatures of about 400° C. to about 425° C.

In some embodiments, deposition of boron and carbon films (B,C) can be performed at process temperatures of up to about 400° C. For example, in some embodiments, deposition of boron and carbon films (B,C) in batch reactors can be performed at process temperatures of about 250° C. to about 400° C., preferably about 275° C. to about 375° C., and more preferably about 300° C. to about 350° C.

According to some embodiments of the present disclosure, the pressure of the reactor chamber during processing is maintained at about 0.001 Torr to about 760 Torr, including about 0.01 Torr to about 50 Torr, preferably from about 0.1 Torr to about 10 Torr, and more preferably from about 1 Torr to about 10 Torr. In some embodiments, deposition of boron and carbon films can be performed with a reactor chamber pressure of about 0.5 Torr to about 8 Torr. For example, the reactor chamber pressure may be about 6 Torr. The selected reaction chamber pressure may serve to facilitate formation of the desired boron and carbon films. In some embodiments, the chamber pressure may be selected based on a configuration of the reactor chamber (e.g., a batch reactor or a single wafer reactor). In some embodiments, a batch reactor may have a reactor chamber pressure from about 0.001 Torr to about 10 Torr. In some embodiments, the chamber pressure may be selected to provide a boron and carbon film which has desired conformality, diffusion resistance and/or etch rate performances.

As described herein, a carrier gas may comprise an inert carrier gas, such as nitrogen gas (N$_2$), helium (He), xenon (Xe) and/or neon (Ne). For example, block 102 of FIG. 1 may include exposing a substrate to one or more boron reactants and nitrogen gas. Without being limited by any particular theory or mode of operation, nitrogen gas, helium, xenon, and neon can exhibit an increased thermal conductivity (e.g., for example a greater thermal conductivity as compared to that of other inert carrier gases, such as argon (Ar)), thereby facilitating decomposition of the one or more boron and/or carbon precursors. Further, without being limited by any particular theory or mode of operation, a carrier gas having an increased thermal conductivity may facilitate decomposition of the one or more boron and/or carbon precursors in high aspect ratio features of a 3-D substrate surface, facilitating formation of a conformal wet etch protection boron and carbon film over the high aspect ratio features. For example, use of carrier gas comprising nitrogen gas, helium, xenon, and/or neon, including carrier gas mixtures comprising two or more of nitrogen gas, helium, xenon, neon, argon and/or hydrogen, may facilitate formation of a conformal wet etch protection boron and carbon film.

In some embodiments, a carrier gas may comprise argon (Ar). For example, block 102 of FIG. 1 may include exposing a substrate to one or more vapor phase boron reactants and argon gas.

In some embodiments, flow of one or more of the vapor phase boron reactants into the reaction space can be continuous or substantially continuous. For example, a process 100 for depositing the boron and carbon (B,C) film may comprise a continuous flow thermal CVD process. For example, flow of the one or more vapor phase boron reactants into the reaction chamber can be continued until a desired boron and carbon film thickness is achieved. In some embodiments, flow rate of a boron reactant and/or carrier gas may be varied during a continuous flow thermal CVD process to provide the desired boron and carbon film. In some embodiments, a process temperature and/or reactor chamber pressure may be varied during a continuous flow thermal CVD process to provide the desired boron and carbon film.

In some embodiments, process 100 for depositing the boron and carbon (B,C) film comprises a thermal CVD process. In some embodiments, the process 100 may comprise a cyclic deposition process. For example, a cycle of the process 100 may comprise contacting the substrate with a reactant for a desired amount of time, such as by supplying into the reactor chamber a reactant pulse for a desired duration. The reactant pulse may comprise a carrier gas (e.g., argon, nitrogen gas, helium and/or neon) and at least one or more boron reactants. In some embodiments, the reactant pulse is repeated a number of times to deposit a boron and carbon film of desired thickness and/or composition (e.g., repetition of a number of cycles, each cycle comprising the reactant pulse).

In some embodiments one or more reactant pulses can be followed by a step in which the substrate is not exposed to the reactant(s), such as a purge step and/or transport of the substrate into a space free or substantially free of the reactants. For example, the substrate may first be transported to a space free or substantially free of the reactants and the reactor chamber may then be purged of any excess reactants and/or reaction byproducts. In some embodiments each reactant pulse of a plurality of reactant pulses may be followed by a purge step and/or transport of the substrate to a space free or substantially free of the reactants. The purge step may be configured to remove one or more excess reactants and/or reaction byproducts from the reactor chamber. For example, a purge step may comprise flowing one or more purge gases through the reactor chamber, and/or evacuating the reactor chamber to remove or substantially remove excess reactants and/or reaction byproducts (e.g., by drawing a vacuum upon the reactor chamber). In some embodiments, the purge gas comprises an inert gas. In some embodiments, the purge gas comprises nitrogen gas. In some embodiments, the purge gas comprises a noble gas. In some embodiments, the purge gas comprises argon gas.

In some embodiments, a reactant pulse can be followed by discontinuing flow of the one or more vapor phase boron reactants into the reactor chamber while continuing flow of the carrier gas. For example, a purge step may comprise continued flow of the carrier gas (e.g., at a same or different flow rate, such as a higher flow rate, as compared to that during the reactant pulse) in order to remove reactant from the reaction chamber. In some embodiments, a purge step may comprise continuing flow of at least one component of a carrier gas comprising a mixture of two or more gases for removing excess reactant from the reactor chamber. In some embodiments, a process 100 for depositing boron and carbon films may include continuously flowing the carrier gas while alternating flow of the one or more vapor phase boron reactants.

In some embodiments, the one or more boron reactants are supplied into the reactor chamber from a respective source container in which the reactants are stored in vapor form. Vapor pressure of each reactant can facilitate delivery of the reactant into the reactor chamber. For example, the vaporized reactants can be provided into the reactor chamber using a vapor draw technique. In some embodiments, a source container can be maintained at a temperature of about 20° C. to about 80° C. for example around 25° C. A mass flow rate of a vaporized reactant into the reactor chamber may be controlled, for example, by controlling the extent to which a supply valve for providing the vaporized reactant into the reactor chamber is kept open. Alternatively, the vapor may be created by providing the liquid from a supply through a liquid flow meter and evaporator all at about 25-100° C.

In some embodiments, a suitable boron reactant may include one or more compounds comprising a B—C bond. In some embodiments, a suitable boron reactant can include a boron compound having at least one organic ligand. In some embodiments, the organic ligand can have double and/or triple bonds. In some embodiments, the organic ligand can be a cyclic ligand. In some embodiments, the organic ligand can comprise delocalized electrons. In some embodiments, a suitable boron reactant can include trialkylboron compounds. In some embodiments, a suitable boron reactant can include triethylboron ($B(C_2H_5)_3$, TEB). In some embodiments, a suitable boron reactant can include trimethylboron ($B(CH_3)_3$, TMB). In some embodiments, a suitable boron reactant can include trialkylboron compounds having linear or branched alkyl groups, including for example linear or branched C3-C8, and more preferably including linear or branched C3-C5. Suitable boron reactants can include a variety of other boron-containing reactants. In some embodiments, a boron reactant can include a boron halide, an alkylboron, and/or a borane. In some embodiments, a boron reactant can include boron halides, borane halides and complexes thereof. For example, a suitable boron halide may have a boron to halide ratio of about 0.5 to about 1.

Suitable boranes can include compounds according to formula I or formula II:

$$B_xH_{n+x} \qquad \text{(formula I)}$$

Wherein n is an integer from 1 to 10, preferably from 2 to 6, and x is an even integer, preferably 4, 6 or 8.

$$B_nH_m \qquad \text{(formula II)}$$

Wherein n is an integer from 1 to 10, preferably from 2 to 6, and m is an integer different than n, from 1 to 10, preferably from 2 to 6.

Of the above boranes according to formula I, examples include nido-boranes ($B_nH_{n+4}$), arachno-boranes ($B_nH_{n+6}$) and hyph-boranes ($B_nH_{n+8}$). Of the boranes according to formula II, examples include conjuncto-boranes ($B_nH_m$). Also, borane complexes such as $(CH_3CH_2)_3N$—$BH_3$ can be used.

In some embodiments, suitable boron reactants can include borane halides, particularly fluorides, bromides and chlorides. An example of a suitable compound is $B_2H_5Br$. Further examples comprise boron halides with a high boron/halide ratio, such as $B_2F_4$, $B_2Cl_4$ and $B_2Br_4$. It is also possible to use borane halide complexes.

In some embodiments, halogenoboranes according to formula III can be suitable boron reactants.

$$B_nX_n \quad \text{(formula III)}$$

Wherein X is Cl or Br and n is 4 or an integer from 8 to 12 when X is Cl, or n is an integer from 7 to 10 when X is Br.

In some embodiments, carboranes according to formula IV can be suitable boron reactants.

$$C_2B_nH_{n+x} \quad \text{(formula IV)}$$

Examples of carboranes according to formula IV include closo-carboranes ($C_2B_nH_{n+2}$), nido-carboranes ($C_2B_nH_{n+4}$) and arachno-carboranes ($C_2B_nH_{n+6}$).

In some embodiments, amine-borane adducts according to formula V can be suitable boron reactants.

$$R_3NBX_3 \quad \text{(formula V)}$$

Wherein R is linear or branched $C_1$ to $C_{10}$, preferably C1 to C4 alkyl or H, and X is linear or branched C1 to C10, preferably C1 to C4 alkyl, H or halogen.

In some embodiments, aminoboranes where one or more of the substituents on B is an amino group according to formula VI can be suitable boron reactants.

$$R_2N \quad \text{(formula VI)}$$

Wherein R is linear or branched $C_1$ to $C_{10}$, preferably $C_1$ to $C_4$ alkyl or substituted or unsubstituted aryl group.

An example of a suitable aminoborane is $(CH_3)_2NB(CH_3)_2$.

In some embodiments, a suitable boron reactant can include a cyclic borazine (—BH—NH—)$_3$ and/or its volatile derivatives.

In some embodiments, alkyl borons or alkyl boranes can be suitable boron reactants, wherein the alkyl is typically linear or branched C1 to C10 alkyl, preferably C2 to C4 alkyl.

According to some embodiments, a process for depositing a boron and carbon (B,C) film comprises a thermal CVD process performed at a process temperature of about 375° C. to about 400° C., and at a pressure of about 0.1 Torr to about 3 Torr. The process may include contacting the substrate with a reactant pulse comprising nitrogen gas as the carrier gas and triethylboron (TEB) as the boron and carbon reactant. The supply of TEB may be drawn from a source container for storing TEB at a temperature of about 20° C. to about 80° C., for example around 25° C. (e.g., a needle valve for providing TEB flow into the reactor chamber may be kept open at about two turns).

One or more boron and carbon (B,C) films formed according to one or more processes described herein may advantageously demonstrate desired conformality, such as when deposited on high aspect ratio features of 3-D substrate surfaces, and/or desired etch rate performances (e.g., wet etch rate performance, such as wet etch rate performance in a HF solution). The films may also exhibit a reduced film density, such as film densities of about 2.0 grams per cubic centimeter (g/cm³) to about 2.5 g/cm³. In some embodiments, the boron and carbon films can demonstrate a conformality of greater than about 80%, preferably greater than about 90% and more preferably greater than about 95%, for example when the boron and carbon films are formed on 3-D structures having aspect ratios of about 3:1 or higher, including about 10:1 or higher, about 25:1 or higher, or about 50:1 or higher. In some embodiments, the boron and carbon films can demonstrate a conformality of greater than about 80%, preferably greater than about 90% and more preferably greater than about 95%, when the boron and carbon films are formed on 3-D structures having aspect ratios of about 20:1 or greater, about 40:1 or greater, or about 80:1 or greater. For example, one or more boron and carbon films formed according to one or more processes described herein may demonstrate a conformality performance of greater than about 95% when deposited on high aspect ratio features of a 3-D substrate surface, including aspect ratios of up to about 250:1, including about 150:1 and about 100:1.

As described herein, a boron and carbon (B,C) film can be used in some embodiments as a sacrificial film in a semiconductor device fabrication process. For example, the boron and carbon film may be selectively removed in an etch process. In some embodiments, a boron and carbon film may form a part of a finished semiconductor device. For example, the boron and carbon film may be more protective to wet etch than one or more other materials used in the fabrication of the semiconductor device. In some embodiments, the boron and carbon film may be etched by a dry etch process and/or a wet etch process. In some embodiments, a sacrificial boron and carbon film can be selectively removed during fabrication of a semiconductor device using an etch process comprising chlorine (Cl) and/or fluorine (F), such as chlorine and/or fluorine containing plasma processes. In some embodiments, the boron and carbon films can be more protective to one or more etchants, including wet etchants such as HF solutions.

In some embodiments, the wet etch protection layer forms a diffusion barrier protecting the underlying substrate for diffusion of the hydrofluoric acid solution through the barrier. A wet etch protection layer may be resistant to wet etching however diffusion trough the layer may be still a problem when a hydrofluoric acid solution is diffusing through the wet etch protection layer and subsequently etching the underlying layer. The boron and carbon-comprising wet etch protection layer with a thickness of at least about 5 nm, for example about 10 nm, about 20 nm or about 30 nm will protect the underlying substrate for diffusion of the hydrofluoric acid solution. The wet etch protection layer forms a diffusion barrier protecting the underlying substrate for a hydrofluoric acid solution with a hydrogen fluoride concentration of at least about 10 wt. %, preferably at least about 20 wt. %, more preferably at least about 30 wt. %, and even more preferably at least about 49 wt. % for at least about 5 minutes, preferably at least about 10 minutes, and most preferably at least about 20 minutes.

In some embodiments, the boron and carbon film can advantageously demonstrate desirable wet etch rates, including etch rates in a HF solution. For example, the boron and carbon film can advantageously demonstrate etch rates of less than about 0.2 nanometers per minute (nm/min), including preferably less than about 0.1 nm/min, more preferably less than about 0.05 nm/min, and most preferably less than about 0.02 nm/min. As will be described in further details below, boron and carbon materials deposited according to one or more processes described herein may advantageously demonstrate desired resistance to wet etchants, including a HF solution. In some embodiments, boron and carbon films can be resistant or substantially resistant to HF after exposure to HF for more than about 30 seconds, preferably more than about 60 seconds, or more preferably more than about 120 seconds. In some embodiments, boron and carbon films can be resistant or substantially resistant to HF exposure for up to about 5 minutes, or up to about 10 or 20 minutes. For example, boron and carbon films may demonstrate etch rates of less than about 0.1 nm/min, less than about 0.05 nm/min, or less than about 0.02 nm/min when exposed to HF. In some embodiments, boron and carbon films can be resistant or substantially resistant to HF exposure for longer than about 10 minutes or even about 20 minutes.

In some embodiments, the boron and carbon film can demonstrate wet etch rates of less than about 0.2 nm/min, including preferably less than about 0.1 nm/min, more preferably less than about 0.05 nm/min, and most preferably less than about 0.02 nm/min in the following wet etchant solutions and at the specified temperatures: phosphoric acid ($H_3PO_4$) solution at a concentration of about 85 wt. % at about room temperature (e.g., a temperature of about 25° C.), a concentrated nitric acid $HNO_3$ solution (e.g., a solution having a $HNO_3$ concentration of about 65 to about 75 wt. %) at about 80° C., a 5.5 wt. % hydrofluoric acid (HF) at about room temperature (e.g., a temperature of about 25° C.), a solution having a ratio of nitric acid:hydrofluoric acid:water ($HNO_3$:HF:$H_2O$) at about 1:1:5 at about room temperature (e.g., a temperature of about 25° C.), an aqueous solution of sodium hydroxide (NaOH) having a concentration of NaOH of about 10 wt. % at about room temperature (e.g., a temperature of about 25° C.), a concentrated hydrochloric acid (HCl) solution (e.g., a solution having an HCl concentration of about 35 to about 40 wt. %) at about room temperature (e.g., a temperature of about 25° C.), and a concentrated sulfuric acid solution ($H_2SO_4$) (e.g., a solution have a $H_2SO_4$ concentration of greater than about 90 wt. %) at about room temperature (e.g., a temperature of about 25° C.).

In some embodiments, the boron and carbon film may cause an etch selectivity (e.g., a dry etch and/or a wet etch selectivity) of an underlying layer with respect to a not covered layer of about 5 or greater, including a selectivity of about 10 or greater, about 20 or greater, or about 50 or greater.

In some embodiments, a portion of a boron and carbon film deposited on a sidewall of a three-dimensional structure can demonstrate a desired etch selectivity, for example, as compared to an etch selectivity of a portion of the film deposited on a top surface of the three-dimensional feature. In some embodiments, a portion of a boron and carbon film deposited on a sidewall of a three-dimensional structure can demonstrate a uniform or substantially uniform etch selectivity as a portion of the boron and carbon film deposited on a top surface of the structure. For example, a ratio of an etch selectivity of a sidewall portion of the boron and carbon film to an etch selectivity of a top surface portion of the boron and carbon film can be less than about 4, including less than about 2, about 1.5. In some embodiments, the ratio is about 1. In some embodiments, a uniformity of a top surface portion and a sidewall portion of the boron and carbon film can be maintained after being exposed to one or more plasma processes, such as a plasma post-deposition treatment process as described herein.

One or more process parameters for boron and carbon (B,C) film growth process may be adjusted to achieve a desired boron and carbon film characteristic. For example, selection of a boron reactant, a duration of a reactant pulse, a duration of a purge step, a process temperature, and/or a number of repetitions of the reactant pulse, may be determined to provide a boron and carbon film comprising desirable characteristics. In some embodiments, one or more parameters of one cycle of a reactant pulse and purge step can be different from that of another cycle (e.g., one cycle of the reactant pulse and purge step as described with reference to FIG. 1). In some embodiments, a boron reactant can have a B—C bond. In some embodiments, a boron reactant comprises at least one organic ligand, such as a hydrocarbon ligand, including a boron reactant comprising an alkyl group.

As described herein, one or more processes described herein may be used to form a boron and carbon film on the substrate, where the boron and carbon films have a thickness in the nanometer range. In some embodiments, the boron and carbon film can have a thickness of at least about 5 nm, about 10 nm, about 20 nm, or about 30 nm.

In some embodiments, the boron and carbon film may be deposited by a non-pulsed thermal CVD process (e.g., using a single continuous exposure to precursors). In some embodiments, the boron and carbon film may be formed according to one or more cyclic processes described herein, such as a cyclic pulsed CVD processes described herein. For example, a cycle of a pulsed CVD process for forming the boron and carbon film may include exposing the substrate to one or more boron precursors for a duration, followed by an interval during which the substrate is not exposed to the boron precursors (e.g., by removing the substrate to an environment free or substantially free of the precursors, and/or by performing purge step). As described herein, supply of the one or more boron precursors into the reaction space may be accompanied by a carrier gas. In some embodiments, the boron and carbon film may be formed by performing about 1 to about 100 cycles, preferably about 2 to about 50 cycles, and more preferably about 3 to about 20 cycles. In some embodiments, the boron and carbon-comprising wet etch protective layer may have a thickness of at least about 5, preferably about 10 nm, more preferably about 20 nm and, most preferably about 30 nm by decomposing the vapor phase boron precursor on the substrate.

In some embodiments, a deposition rate of the boron and carbon film can depend on a composition of the material on which the boron and carbon material is deposited. For example, a deposition rate on an aluminum nitride (AlN) substrate of a boron and carbon film process may be lower than that of a similar or same boron and carbon deposition process when depositing on a silicon nitride (SiN) substrate.

In some embodiments, a process for forming the boron and carbon film may include continuously or substantially continuously flowing one or more boron precursors. For example, the process may comprise a continuous flow thermal CVD process. In some embodiments, a continuous flow process may provide a shorter process (e.g., due to elimination of purge steps). In some embodiments, a continuous flow process may provide improved uniformity. In some embodiments, continuous flow can be selected to provide desired accuracy in control of precursor dose and/or precursor concentration in the reaction space. In some embodiments, continuous flow can be selected based on a configuration of the reactor chamber. In some embodiments, a continuous flow process may be selected for a reactor chamber having relatively larger reaction space volume. For example, a continuous flow process may be selected for a batch reactor. In some embodiments, a continuous flow process may be selected for a reactor chamber having relatively higher accuracy in dose control. For example, a continuous flow process may be selected for a CVD reactor chamber.

In some embodiments, the boron and carbon material may be formed in a single wafer reactor. In some embodiments, the boron and carbon film may be formed in a batch reactor. For example, a deposition process for forming the boron and carbon film may be performed in a vertical CVD batch reactor. For example, the batch reactor may be configured to process a wafer load of about 25 wafers to about 200 wafers, preferably about 50 wafers to about 150 wafers.

As mentioned above, in some embodiments a process temperature for depositing the boron and carbon film in a batch reactor can be about 250° C. to about 400° C., preferably from about 275° C. to about 375° C., and more preferably about 300° C. to about 350° C.

In some embodiments, a boron and carbon film can demonstrate a 1 sigma (1 σ) non-uniformity of less than about 5%, preferably less than about 2%. For example, an boron and carbon film deposited on a 300 millimeter (mm) wafer using one or more processes described herein may demonstrate a 1 sigma non-uniformity of less than about 2%. In some embodiments, relatively lower process temperatures can be used to achieve relatively lower uniformity performances.

In some embodiments, a boron and carbon film can be used to enhance the etch selectivity performance of a structure comprising the boron and carbon film and another different material. For example, the other material may comprise a material having relatively less resistance to certain etchants, including certain wet etchants, such as HF. Use of the boron and carbon film together with the other different material may advantageously facilitate formation of a resulting structure having desired etch properties as well as desired properties of the other different material.

In some embodiments, the other material can comprise one or more of a nitride, carbide, oxide, and/or mixtures thereof. In some embodiments, the other material can comprise one or more of a nitride, a carbide, and/or an oxide of a metal and/or a semimetal. In some embodiments, the other material can comprise one or more of a nitride of a metal and/or a semimetal. For example, the one or more nitrides may include silicon nitride, germanium nitride, and/or aluminum nitride. In some embodiments, the other material can comprise one or more of a carbide of a metal and/or a semimetal. In some embodiments, the other material can comprise one or more of an oxide of a metal and/or a semimetal. For example, the one or more oxides may include germanium oxide, and/or silicon oxide.

In some embodiments, the other material may be formed using an ALD and/or CVD process, including plasma enhanced ALD and/or CVD processes. In some embodiments, the other material can preferably be formed using an ALD process, and more preferably using a low-temperature ALD process (e.g., process temperatures of up to about 400° C.). In some embodiments, the other material may be formed in a same tool as the boron and carbon material (e.g., cluster tool). For example, the reaction chamber used for depositing the boron and carbon material may be on the same cluster tool as the reaction chamber used to deposit the other material, such that transfer between the reaction chambers can be performed without exposing the substrate to ambient air (e.g., "in-situ"). In some embodiments, the same reaction chamber can be used for depositing both the boron and carbon material and the other material, and the substrate is not exposed to ambient air between depositing the boron and carbon material and the other material.

In some embodiments, the other material can be deposited first and the boron and carbon film can be deposited on the other material. For example, the other material may be a substrate on which the boron and carbon film is deposited. For example, the boron and carbon film can serve as a cap layer for the other material. In some embodiments, the boron and carbon film can be deposited first and the other material deposited on the boron and carbon film. For example, the boron and carbon film can serve as an etch stop layer for the other material. Use of the boron and carbon film as a cap layer and/or an etch stop layer with the other material can facilitate tuning of etch properties of the resulting structure.

As described herein, in some embodiments, a boron and carbon film (B,C) can serve as a dopant film, such as a solid state diffusion (SSD) layer. In some embodiments where the boron and carbon film serves as a dopant film, a cap layer is not required over the boron and carbon film. In some embodiments a boron and carbon film (B,C) can itself serve as a cap layer over a different SSD layer, for doping a substrate. A boron and carbon dopant film may be formed according to one or more processes described herein. For example, a process for depositing a boron and carbon solid state diffusion layer and/or a boron and carbon cap layer may comprise a pulsed thermal CVD process. In some embodiments, the thermal CVD process may include contacting a surface on which the boron and carbon film is deposited with one or more reactant pulses comprising one or more boron reactants described herein. For example, a reactant pulse may include a boron reactant comprising a B—C bond, including a boron reactant comprising an organic ligand, such as a trialkylboron (e.g., triethylboron ($B(C_2H_5)_3$), TEB, and/or trimethylboron ($B(CH_3)_3$), TMB). In some embodiments, the reactant pulse comprises a carrier gas, such as argon gas. For example, a cycle of a thermal CVD process for depositing the boron and carbon solid state diffusion layer and/or boron and carbon cap layer may include a reactant pulse comprising TEB and argon gas, where the reactant pulse is followed by a purge step comprising flow of argon gas and in which flow of the TEB is not flowed, such that flow of argon gas is continued throughout the cycle while TEB is flowed only during a portion of the cycle.

In some embodiments, processes for depositing the boron and carbon solid state diffusion layer and/or boron and carbon cap layer can be performed at process temperatures of about 300° C. to about 450° C., including about 350° C. to about 450° C., or about 400° C. to about 450° C. For example, the boron and carbon solid state diffusion layer and/or boron and carbon cap layer may be deposited at a temperature of about 430° C. In some embodiments, the boron and carbon solid state diffusion layer and/or boron and carbon cap layer can be deposited at a reactor chamber pressure of about 0.1 Torr to about 10 Torr, for example about 6 Torr.

In some embodiments, a boron and carbon film thickness can be selected to provide desired doping on the underlying substrate. For example, a thickness of a boron and carbon solid state diffusion layer and/or a boron and carbon cap layer may be selected to achieve desired substrate doping.

Figure 2:
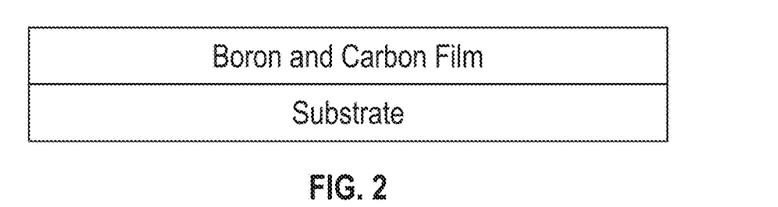
FIG. 2 shows an example of a substrate comprising a boron and carbon-comprising film, according to some embodiments.

FIG. 2 shows an example of film stacks comprising boron and carbon (B,C) films. FIG. 2 shows a boron and carbon dopant film deposited directly on a substrate. For example, the boron and carbon film may be deposited directly on a quartz, glass or semiconductor substrate.

Figure 3:
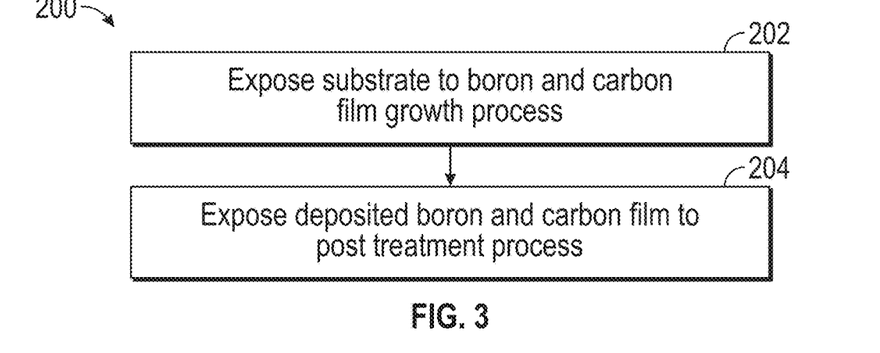
FIG. 3 shows a flow chart of another example of a process for depositing a boron and carbon-comprising film, according to some embodiments.

FIG. 3 shows a flow chart 200 of another example of a process for forming boron and carbon (B,C) films, according to some embodiments. In block 202, the substrate is exposed to a boron and carbon film growth process. The boron and carbon film growth process may comprise a deposition process, such as a pulsed thermal CVD process, for depositing a boron and carbon film of a desired thickness and/or composition.

In block 204, a post-deposition treatment process can be carried out on the deposited boron and carbon film. In some embodiments, the post-deposition treatment process comprises a plasma process. For example, the treatment process may comprise contacting the deposited boron and carbon film with one or more energized species for a duration of time. In some embodiments, the post-deposition treatment process comprises contacting the substrate comprising the boron and carbon film with a plasma. For example, the substrate can be contacted with a plasma generated using nitrogen-containing compounds (e.g., nitrogen gas), a noble gas, and/or oxygen-containing compounds (e.g., oxygen gas and/or ozone). In some embodiments, the post-deposition treatment process can be followed by a purge step. For example, the purge step may include flow of nitrogen gas and/or one or more noble gases. In some embodiments, purging the reactor chamber subsequent to the post-deposition treatment process can include turning off the plasma power while continuing to flow one or more of the gases used to generate the plasma for the post-deposition treatment process. For example, during the purge step the one or more gases used in generating the plasma for the post-deposition treatment process may continue to be flowed into the reactor while the plasma power is turned off, the flow rate of the one or more gases during the purge step being the same as or different from that during the post-deposition treatment process.

As described herein, in some embodiments, a plasma post-deposition treatment process may comprise contacting a deposited boron and carbon film with a nitrogen-containing plasma (e.g., contacting the deposited boron and carbon film with nitrogen-containing radicals and/or ions). One or more nitrogen-containing compounds may be used to generate the nitrogen-containing plasma, such as nitrogen-containing compounds which do not have hydrogen (H). For example, the plasma post-deposition treatment process may comprise energetic species generated using nitrogen gas ($N_2$).

In some embodiments, the plasma post-deposition treatment process comprises exposing the boron and carbon film to the nitrogen-containing plasma for a duration of about 1 to about 500 seconds (s), 10 s to about 300 s, including about 10 s to about 100 s, or about 10 s to about 50 s. The nitrogen-containing plasma post-deposition treatment process may be performed at a process temperature of about 100° C. to about 500° C., including about 200° C. to about 500° C., and about 200° C. to about 400° C., and a pressure of about 0.1 Torr to about 20 Torr, including about 1 Torr to about 10 Torr, and about 1 Torr to about 8 Torr. In some embodiments, a plasma power for generating the nitrogen-containing plasma can be about 50 Watts (W) to about 2000 W, including about 50 W to about 1000 W, about 100 W to about 400 W, and about 200 W to about 400 W.

In some embodiments, a plasma post-deposition treatment process comprises contacting a deposited boron and carbon film with a noble gas-containing plasma (e.g., contacting the deposited boron and carbon film with noble gas-containing radicals and/or ions). For example, the plasma post-deposition treatment process may comprise a plasma comprising energetic species generated using helium (He) gas, argon gas (Ar) and/or neon (Ne) gas. In some embodiments, the plasma post-deposition treatment process comprises exposing the boron and carbon film to the noble gas-containing plasma for a duration of about 10 seconds (s) to about 300 s, including about 10 s to about 100 s. The noble gas-containing plasma post-deposition treatment process may be performed at a process temperature of about 100° C. to about 500° C., including about 200° C. to about 500° C., and about 200° C. to about 400° C., and a pressure of about 0.1 Torr to about 20 Torr, including about 1 Torr to about 10 Torr, and about 1 Torr to about 8 Torr. In some embodiments, a plasma power for generating the noble gas-containing plasma can be about 50 Watts (W) to about 2000 W, including about 50 W to about 1000 W, about 100 W to about 400 W, and about 200 W to about 400 W.

In some embodiments, a plasma post-deposition treatment process can be performed once subsequent to depositing a boron and carbon film of a desired thickness and/or composition. In some embodiments, a plasma post-deposition treatment process can be carried out at intervals after every repetition of a number of cycles of a deposition process for depositing the boron and carbon film (e.g., after a number of repetitions of a cycle of the reactant pulse and purge step as described with reference to FIG. 1). For example, a plasma post-deposition treatment process may be performed after every 1, 2, 5, 10, 100, 1,000 cycles of a boron and carbon film deposition process. Other numbers of cycles may also be suitable.

A suitable reaction chamber for one or more boron and carbon (B,C) film deposition processes described herein may be part of a cluster tool in which a variety of different processes in the formation of an integrated circuit are carried out. In some embodiments, one or more boron and carbon film deposition processes described herein can be performed in a batch reactor, including for example in a mini-batch reactor (e.g., a reactor having a capacity of eight substrates or less) and/or a furnace batch reactor (e.g., a reactor having a capacitor of fifty or more substrates). In some embodiments, one or more boron and carbon film deposition processes described herein can be performed in a single wafer reactor. In some embodiments, a spatial reactor chamber may be suitable. In some embodiments, a reactor chamber having a cross-flow configuration can be suitable (e.g., a reactor chamber configured to provide gas flow parallel or substantially parallel to a substrate surface positioned in the reactor chamber). In some embodiments, a reactor chamber having a showerhead configuration can be suitable (e.g., a reactor chamber configured to provide gas flow perpendicular or substantially perpendicular to a substrate surface positioned in the reactor chamber).

Exemplary single wafer reactors are commercially available from ASM America, Inc. (Phoenix, Ariz.) under the tradenames Pulsar® 2000 and Pulsar® 3000 and ASM Japan K.K (Tokyo, Japan) under the tradename Eagle® XP and XP8. Exemplary batch ALD reactors are commercially available from and ASM Europe B.V (Almere, Netherlands) under the tradenames A400™ and A412™.

Examples of B,C Films

Figure 4:
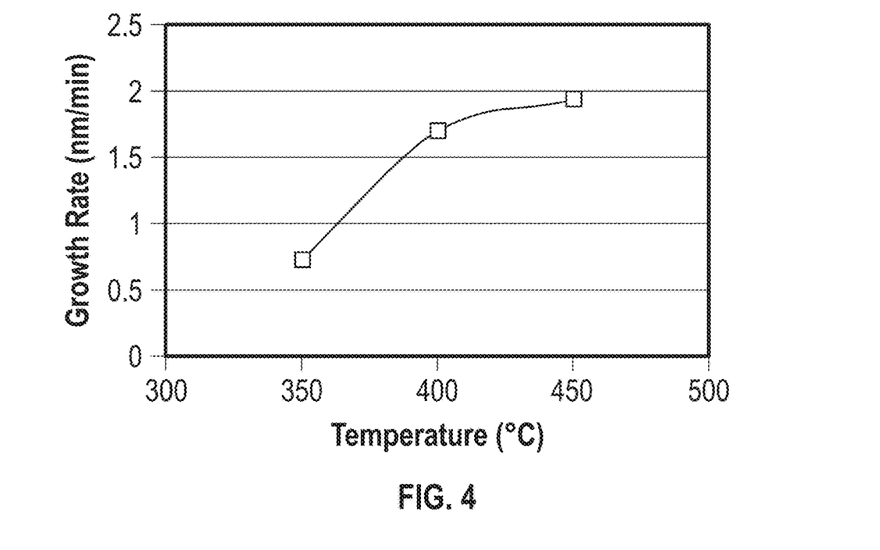
FIG. 4 is a graph of the growth rate of a boron and carbon film versus process temperatures according to an embodiment.

FIG. 4 is a graph of the growth rates of boron and carbon (B,C) films deposited according to some embodiments, in nanometer per minute (nm/min), versus process temperature, in degrees Celsius. The boron and carbon films (B,C) of FIG. 4 were deposited using a thermal CVD process in A412™ reactor. The reactant pulse included supplying TEB and nitrogen gas into the reactor chamber. The TEB was supplied into the reactor chamber using a vapor draw method by providing vaporized TEB from a source container maintained at a temperature of about 20° C. The pressure of the reactor chamber during the reactant pulse was maintained at about 0.1 Torr to about 10 Torr, preferably between 0.2 to 5 Torr. Growth rates of boron and carbon films deposited according to the thermal CVD process were measured at process temperatures of about 350° C., about 400° C. and about 450° C. As shown in FIG. 4, the growth rate of the boron and carbon film increased with increasing process temperature. As shown in FIG. 4, a boron and carbon film deposited using such a thermal CVD process can have a linear or substantially linear relationship with the process temperature.

Figure 5:
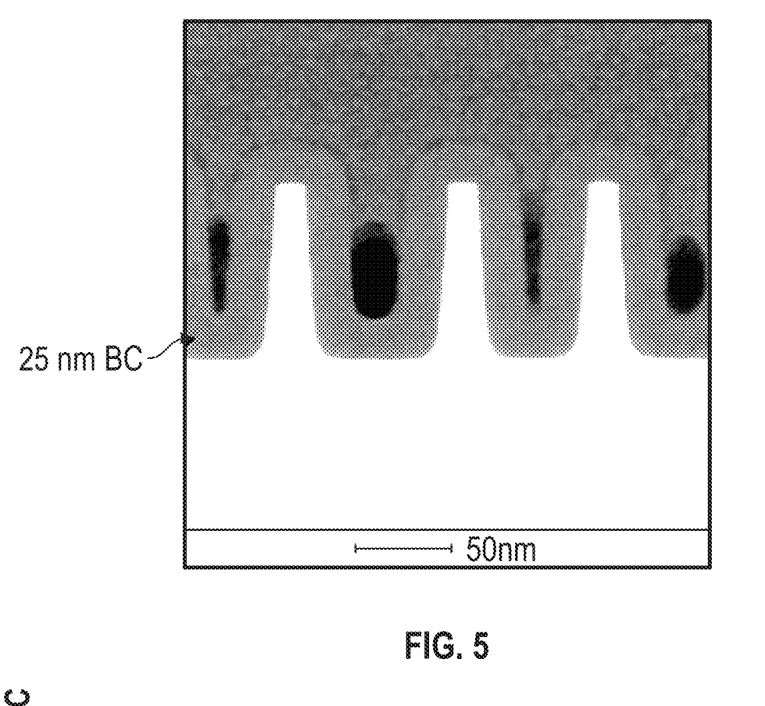
FIG. 5 is a SEM image of a boron and carbon-comprising film deposited on a high aspect ratio trench structure.

Composition of boron and carbon (B,C) films deposited according to the process described with reference to FIG. 4 at a process temperature of about 350° C. was measured by spectroscopic ellipsometry. The refractive index was found to be about 1.98 at a wavelength of about 633 nanometers (nm). FIG. 5 is a scanning electron microscopy SEM image showing a cross-section view of a boron and carbon film deposited on a high aspect ratio trench structure using the deposition process as described with reference to FIG. 4. The boron and carbon film was deposited with a process temperature of about 350° C., in a A412™ reactor chamber as described with reference to FIG. 4. As shown in FIG. 5, a relatively uniform film thickness was achieved on sides of the high aspect ratio trench structure at the upper, mid and lower portions of the trench structure, for example demonstrating the conformality of the deposited boron and carbon film. For example, a film thickness of about 25 nm was measured in an upper portion, a mid-section, and at a lower portion of the trench structure. Without being limited by any particular theory or mode of operation, deposition of the boron and carbon film at a process temperature of about 400° C. or lower may facilitate deposition of the film in a surface reaction limited regime, facilitating improved conformality of the deposited film.

Figure 6:
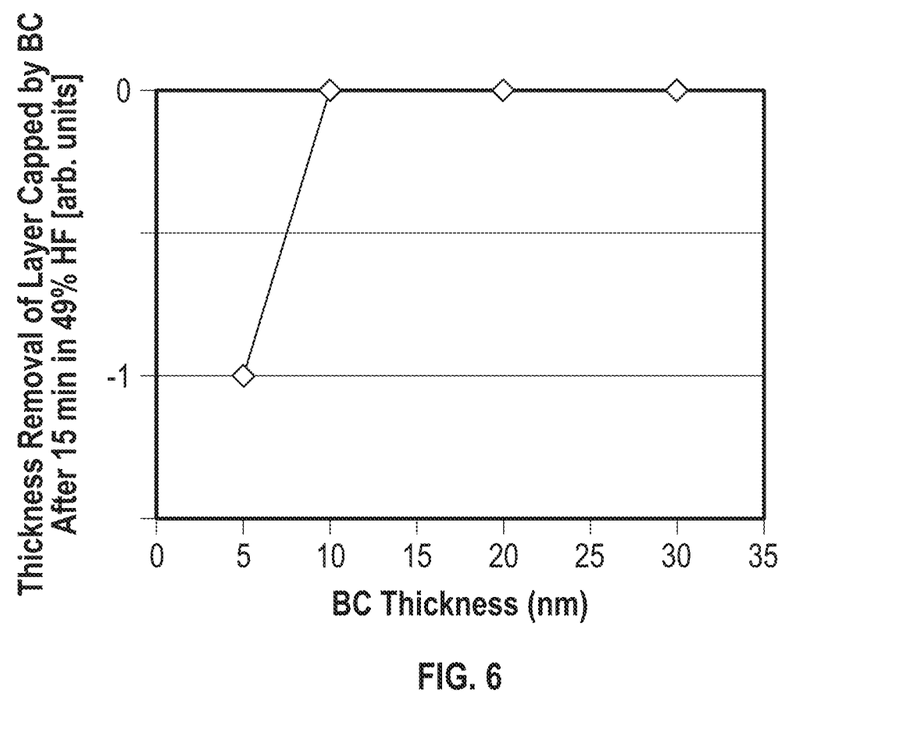
FIG. 6 is a graph showing the removal of a layer underneath a boron and carbon-comprising film when exposed to a wet etchant, according to some embodiments.

FIG. 6 is a graph showing the removal of a layer underneath a boron and carbon film when exposed to 49 wt. % HF solution for 15 minutes. The y-axis shows whether the layer underneath the boron and carbon film is removed (−1) or not (0), after exposing the films to HF for about 15 minutes. The x-axis shows the thickness of the respective boron and carbon-comprising films. Etch performance after exposure for 15 minutes to a 49 wt. % HF solution for 10 nm and thicker boron and carbon films shows no removal of the underlying substrate in FIG. 6. A 5 nm thick boron and carbon film does show removal at the underlying substrate after exposure for 15 minutes to a 49 wt. % HF solution indicating diffusion of HF through the film. A boron and carbon film thicker than 5 nm, for example 10, 20 or 30 nm does not show removal at the underlying substrate after exposure for 15 minutes to a 49 wt. % HF solution. The temperature during etching may vary from 20° C. to 70° C., for example 50° C.

Figure 7:
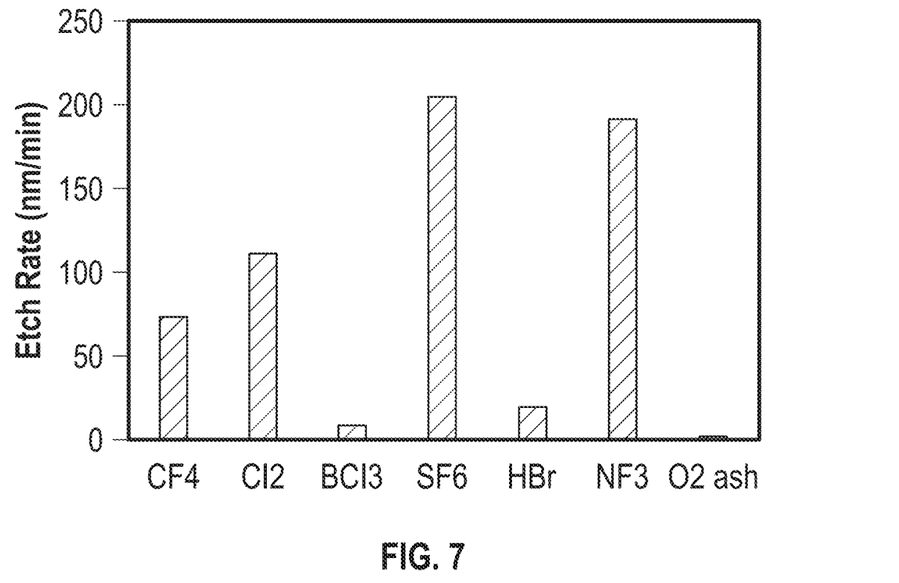
FIG. 7 is a graph showing the removal rate of boron and carbon films when exposed to different etchants, according to some embodiments.

FIG. 7 is a graph showing the removal rate of boron and carbon films when exposed to different etchants, according to some embodiment. The figure shows that the boron and carbon films of FIG. 4 can be removed in $CF_4$, $Cl_2$, $BCl_3$, $SF_6$, HBr, and $NF_3$, solution ion beam and $O_2$ ashing.

Figure 8:
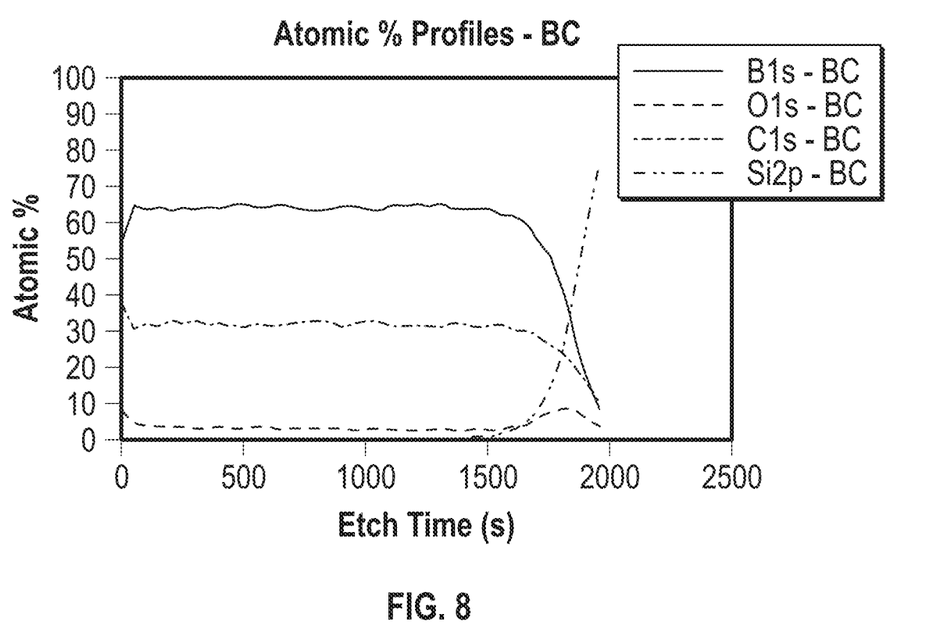
FIG. 8 is a graph showing the in-depth composition of a boron and carbon-comprising film, according to some embodiments.

FIG. 8 is a graph showing the in-depth composition of a boron and carbon film. The figure shows the composition of the etched layer as a function of the etch times in seconds. As shown in FIG. 8, the boron and carbon film mainly included boron, and carbon.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

What is claimed is:

1. A method for processing a substrate comprising:
   heating the substrate to a temperature of between 200 and 450° C.;
   contacting the heated substrate in a reaction space with a vapor phase boron precursor to form a boron and carbon-comprising diffusion barrier and wet etch protection layer with a thickness of greater than 5 nm on the substrate; and
   wet etching the substrate in a hydrofluoric acid solution with a hydrogen fluoride concentration of at least 10 wt. % for at least 5 minutes while protecting at least a portion of the substrate with the boron and carbon-comprising etch protection layer, wherein the boron and carbon-comprising diffusion barrier and wet etch protection layer protects the substrate from diffusion of the hydrofluoric acid solution during wet etching.

2. The method of claim 1, wherein the vapor phase boron precursor comprises triethylboron or trimethylboron.

3. The method of claim 1, wherein the vapor phase boron precursor is supplied to the reaction space with a carrier gas comprising argon.

4. The method of claim 1, further comprising depositing a silicon oxide film on the substrate prior to depositing the boron and carbon-comprising wet etch protection layer.

5. The method of claim 1, wherein the substrate is a semiconductor substrate comprising silicon.

6. The method of claim 1, wherein the substrate comprises silicon oxide.

7. The method of claim 1, further comprising maintaining a pressure of 0.1 Torr to 10 Torr within the reaction space during exposing the substrate to the vapor phase boron precursor.

8. The method of claim 1, wherein the vapor phase boron precursor decomposes on the substrate.

9. The method of claim 1, wherein the wet etch protection layer has a thickness of at least 10 nm.

10. The method of claim 1, wherein the hydrogen fluoride concentration is at least 20 wt. %.

11. The method of claim 1, wherein wet etching the substrate comprises exposing the substrate to the hydrofluoric acid solution for at least 10 minutes.

12. The method of claim 1, further comprising:
   providing a masking layer on the boron and carbon-comprising wet etch protective layer;
   patterning the masking layer;
   anisotropic etching the boron and carbon-comprising wet etch protective layer through the patterned masking layer to create a patterned boron and carbon-comprising wet etch protection layer; and
   wet etching the substrate through the boron and carbon-comprising wet etch protection layer.

13. The method of claim 12, wherein anisotropic etching comprises exposing the boron and carbon-comprising wet etch protective layer to an oxygen-containing plasma.

14. The method of claim 13, further comprising removing the boron and carbon-comprising layer with an ashing process after wet etching.

15. The method of claim 12, wherein anisotropic etching comprises performing ion beam etching.

16. A device manufacturing method comprising:
   providing a substrate in a reaction space;
   heating the substrate to a temperature between 200 and 450° C.;
   forming a boron and carbon-comprising diffusion barrier and wet etch protection layer on the substrate, the wet etch protection layer having a thickness of greater than 5 nm, wherein forming the boron and carbon-comprising wet etch protection layer comprises contacting the heated substrate with a vapor phase boron precursor; and
   wet etching the substrate in a hydrofluoric acid solution with a hydrogen fluoride concentration of at least 10 wt. % for at least 5 minutes while protecting at least a portion of the substrate with the boron and carbon-comprising etch protection layer, wherein the boron and carbon-comprising wet etch protection layer is a diffusion barrier protecting the substrate from diffusion of the hydrofluoric acid solution over the at least 5 minutes.

17. The method according to claim 16, further comprising removing the boron and carbon-comprising layer with an ashing process after wet etching.

\* \* \* \* \*

UNITED STATES PATENT AND TRADEMARK OFFICE
CERTIFICATE OF CORRECTION

PATENT NO. : 11,056,353 B2  
APPLICATION NO. : 15/994236  
DATED : July 6, 2021  
INVENTOR(S) : Pierreux et al.

Page 1 of 1

It is certified that error appears in the above-identified patent and that said Letters Patent is hereby corrected as shown below:

In the Specification

In Column 10, Line 57, delete "$B_xH_{n+x}$" and insert --$B_nH_{n+x}$--.

In Column 10, Line 67, delete "hyph-boranes" and insert --hypho-boranes--.

In Column 11, Line 28, delete "$C_1$ to $C_{10}$," and insert --C1 to C10,--.

In Column 11, Line 36, delete "$C_1$ to $C_{10}$," and insert --C1 to C10,--.

In Column 11, Lines 36-37, delete "$C_1$ to $C_4$" and insert --C1 to C4--.

Signed and Sealed this  
Fourteenth Day of September, 2021

Drew Hirshfeld  
*Performing the Functions and Duties of the*  
*Under Secretary of Commerce for Intellectual Property and*  
*Director of the United States Patent and Trademark Office*